United States Patent
Fu et al.

(10) Patent No.: US 7,629,255 B2
(45) Date of Patent: Dec. 8, 2009

(54) METHOD FOR REDUCING MICROLOADING IN ETCHING HIGH ASPECT RATIO STRUCTURES

(75) Inventors: Qian Fu, Fremont, CA (US); Shenjian Liu, Fremont, CA (US); Wonchul Lee, Fremont, CA (US); Bryan Pu, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 25 days.

(21) Appl. No.: 11/757,950

(22) Filed: Jun. 4, 2007

(65) Prior Publication Data

US 2008/0296736 A1    Dec. 4, 2008

(51) Int. Cl.
*H01L 21/44* (2006.01)
(52) U.S. Cl. .............. 438/672; 438/637; 438/700; 438/622; 438/E21.582
(58) Field of Classification Search ......... 438/637–638, 438/672–673, 700, 618–624
See application file for complete search history.

(56) References Cited

U.S. PATENT DOCUMENTS

| | | | |
|---|---|---|---|
| 6,251,791 B1 | 6/2001 | Tsai et al. | |
| 7,105,098 B1 * | 9/2006 | Shul et al. | 216/41 |
| 2004/0023499 A1 * | 2/2004 | Hellig et al. | 438/694 |
| 2006/0160366 A1 * | 7/2006 | Lu et al. | 438/717 |
| 2008/0064202 A1 * | 3/2008 | Takewaki | 438/625 |

FOREIGN PATENT DOCUMENTS

| | | |
|---|---|---|
| JP | 08-115900 A | 5/1996 |
| JP | 2004-241586 A | 8/2004 |
| JP | 2006-523030 A | 10/2006 |

OTHER PUBLICATIONS

International Search Report dated Sep. 30, 2008 for International Application No. PCT/US2008/065512.
Written Opinion dated Sep. 30, 2008 for International Application No. PCT/US2008/065512.

* cited by examiner

*Primary Examiner*—Dung A. Le
(74) *Attorney, Agent, or Firm*—Beyer Law Group LLP

(57) ABSTRACT

A method for etching features of different aspect ratios in a conductive layer is provided. The method comprises: depositing over the conductive layer with an aspect ratio dependent deposition; etching features into the conductive layer with an aspect ratio dependent etching of the conductive layer; and repeating the depositing and the etching at least once.

10 Claims, 5 Drawing Sheets

METHOD FOR REDUCING MICROLOADING IN ETCHING HIGH ASPECT RATIO STRUCTURES

BACKGROUND OF THE INVENTION

The present invention relates to etching a conductive layer having features of different aspect ratios. More specifically, the present invention relates to reducing microloading during the etching of a conductive layer having both open and dense features.

During semiconductor wafer processing, sometimes a semiconductor device may have both open and dense features. The open features have wider widths, while the dense features have narrower widths. As a result, the semiconductor device may have features of different aspect ratios. The aspect ratio of a feature is the ratio between the height and the width of the feature. Thus, if the heights of all the features of a semiconductor device are approximately the same, then the open features have relatively low aspect ratios, while the dense features have relatively high aspect ratios.

During the etching of such semiconductor devices having features of different aspect ratios, and especially when the aspect ratios of the features are high, microloading is becoming a common problem. As a result, the open features etch faster than the dense features. Often, when the etching of the open features is completed, the etching of the dense features may only have been completed partially. This is known as "aspect ratio dependent etching." Continuing the etch process in order to complete the etching of the dense features may cause the open features to be etched into the layer(s) beneath the layer being etched, such as the substrate, and damage the semiconductor devices.

For aspect ratio dependent etching, typical etch process parameter changes have little or no effect on reducing the microloading among the open and dense features. Accordingly, what is needed are systems and methods to address the above-identified problems.

SUMMARY OF THE INVENTION

To achieve the foregoing and in accordance with the purpose of the present invention, in one embodiment, a method for etching features of different aspect ratios in a conductive layer is provided. The method comprising: depositing over the conductive layer with an aspect ratio dependent deposition; etching features into the conductive layer with an aspect ratio dependent etching of the conductive layer; and repeating the depositing and the etching at least once.

In another embodiment, a method for etching features of different aspect ratios in a conductive layer is provided. The method comprising: depositing over the conductive layer with an aspect ratio dependent deposition; etching features into the conductive layer with an aspect ratio dependent etching of the conductive layer; and repeating the depositing and the etching at least once, wherein aspect ratios of the features are greater than 7:1, widths of wider features are at least 5 times wider than widths of narrower features, the depositing selectively deposits more on bottoms of the wider features than bottoms of the narrower features and sidewalls of the features and the etching selectively etches the wider features faster than the narrower features.

In yet another embodiment, an apparatus for etching features of different aspect ratios in a conductive layer is provided. The apparatus comprising a plasma processing chamber, a gas source, and a controller. The plasma processing chamber comprises: a chamber wall forming a plasma processing chamber enclosure; a substrate support for supporting a substrate within the plasma processing chamber enclosure; a pressure regulator for regulating the pressure in the plasma processing chamber enclosure; at least one electrode for providing power to the plasma processing chamber enclosure for sustaining a plasma; at least one RF power source electrically connected to the at least one electrode; a gas inlet for providing gas into the plasma processing chamber enclosure; and a gas outlet for exhausting gas from the plasma processing chamber enclosure.

The gas source is in fluid connection with the gas inlet of the plasma processing chamber and comprises: a depostion gas source; and an etch gas source.

The controller is controllably connected to the gas source and the at least one RF power source of the plasma processing chamber and comprises: at least one processor; and computer readable media, comprising: computer readable code for depositing over the conductive layer with an aspect ratio dependent deposition; computer readable code for etching features into the conductive layer with an aspect ratio dependent etching of the conductive layer; and computer readable code for repeating the depositing and the etching at least once.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

During the etching of semiconductor devices having features of different aspect ratios or different widths, and especially when the aspect ratios of the features are high, microloading is becoming a common problem because of diffusion. The etching chemicals go inside the wider open features faster than the narrower dense features. Similarly, the byproducts of the etch process come out of the wider open features faster than the narrower dense features. As a result, open features, i.e., features with wider widths, etch faster than dense features, i.e., features with narrow widths.

Figure 1:
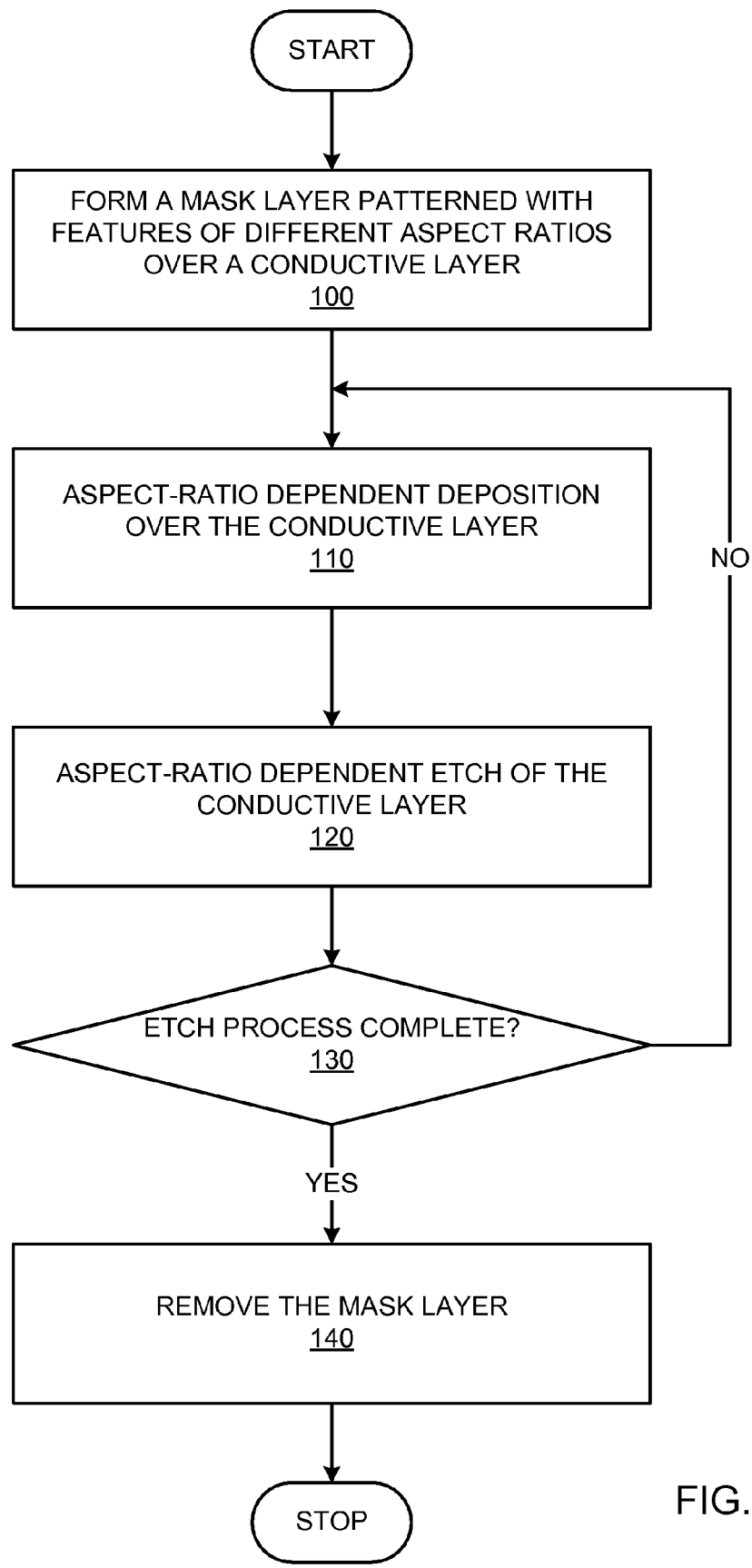
FIG. 1 is a high level flow chart of an embodiment of the invention.

To facilitate understanding, FIG. 1 is a high level flow chart of a process used in an embodiment of the invention. A mask layer patterned with features of different aspect ratios (i.e., open and dense features) is formed over a conductive layer (step 100). The open and dense features will eventually be etched into the conductive layer. An aspect ratio dependent deposition is made over the conductive layer (step 110). In this embodiment, the open (wider) and dense (narrower) features are patterned using a mask or a hard mask over the conductive layer. The deposition over the conductive layer must be aspect ratio dependent so that more materials can be deposited inside the open (wider) features than inside the dense (narrower) features. This aspect ratio dependent deposition is due to the relatively low wafer temperature when deposition is performed in the etch chamber. The deposition process is performed for a specific period of time. In one embodiment, the deposition process is stopped before too much material is deposited over the sidewalls of the features so that the openings of the features are not significantly narrowed.

Next, an aspect ratio dependent etch is made of the conductive layer (step 120). The etch process first etches through the deposition previously deposited over the conductive layer during step 110, and then continues to etch into the conductive layer. Both open (wider) and dense (narrower) features are etched into the conductive layer. Again, the etching of the conductive layer is aspect ratio dependent because the open (wider) features are etched into the conductive layer faster than the dense (narrower) features due to diffusion. But because of the thicker deposition in open (wider) features, etching of the conductive layer can be more delayed than the dense (narrower) features. As long as the etching of the conductive layer on open (wider) features starts later than the dense (narrower) features, etch microloading will be reduced or reversed. The etch process is performed for a specific period of time.

A determination is made as to whether the etch process is completed (step 130). The etch process is completed when all the open and dense features are fully etched into the conductive layer. In other words, the etch process is completed when an etch endpoint in the conductive layer is reached, and the etch endpoint is a predefined level or depth in the conductive layer where the features need to be etched down to. If the etch process is not yet completed, steps 110 and 120 are repeated. If the etch process is completed, the etch process is stopped. In this embodiment, steps 110 and 120 are repeated at least once, but may be repeated as many times as necessary in order to complete the etching of the conductive layer. Optionally, after the etch process is completed, the mask layer may be removed (step 140).

Figure 2:
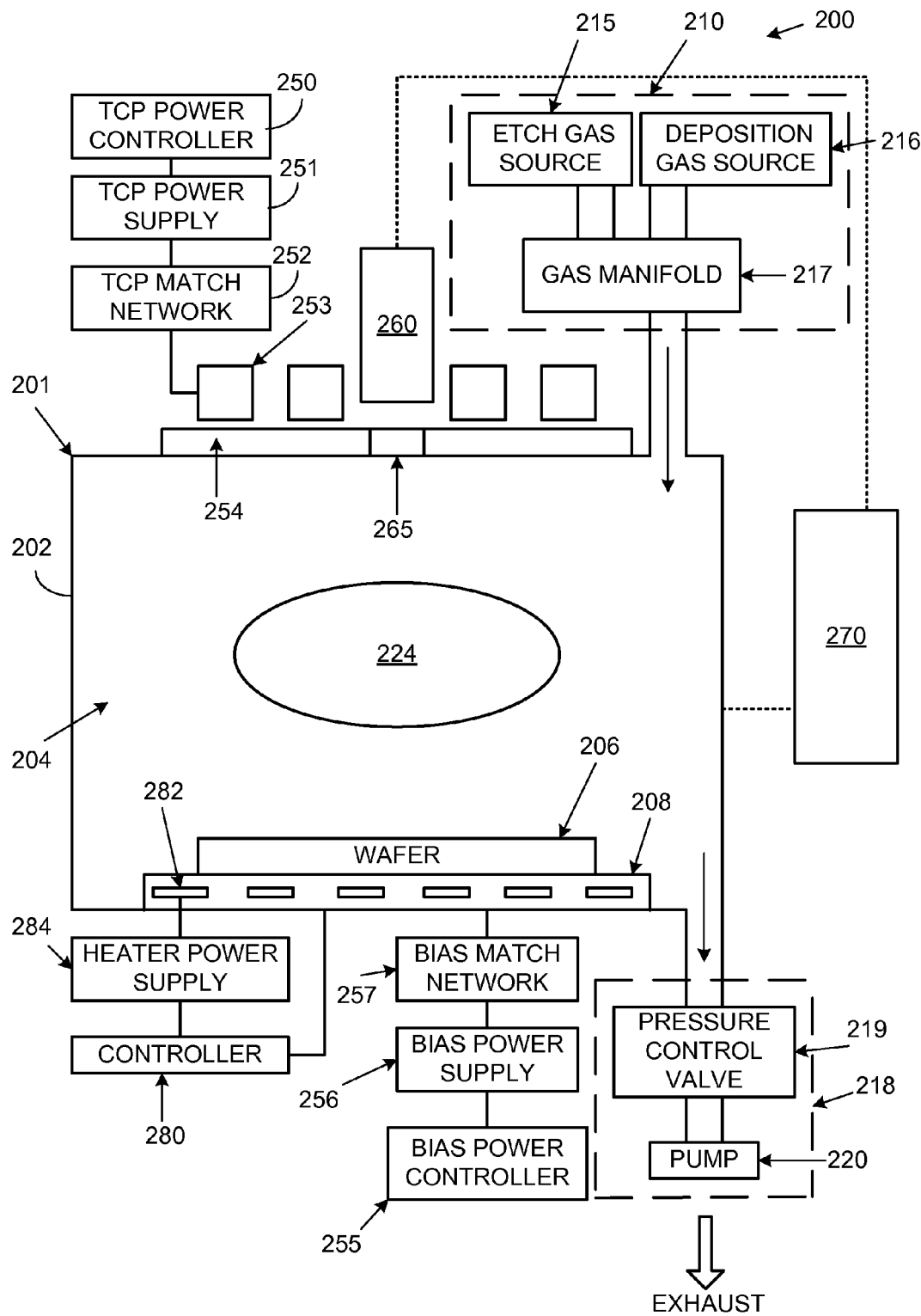
FIG. 2 is a schematic view of a plasma processing chamber that may be used for etching.

To etch the conductive layer, the conductive layer and the related stack may be placed in a plasma processing chamber. FIG. 2 is a schematic view of a plasma processing system 200, including a plasma processing tool 201. The plasma processing tool 201 is an inductively coupled plasma etching tool and includes a plasma reactor 202 having a plasma processing chamber 204 therein. A transformer coupled power (TCP) controller 250 and a bias power controller 255, respectively, control a TCP power supply 251 and a bias power supply 256 influencing the plasma 224 created within plasma chamber 204.

The TCP power controller 250 sets a set point for TCP power supply 251 configured to supply a radio frequency signal at 13.56 MHz, tuned by a TCP match network 252, to a TCP coil 253 located near the plasma chamber 204. An RF transparent window 254 is provided to separate TCP coil 253 from plasma chamber 204 while allowing energy to pass from TCP coil 253 to plasma chamber 204. An optically transparent window 265 is provided by a circular piece of sapphire having a diameter of approximately 2.5 cm (1 inch) located in an aperture in the RF transparent window 254.

The bias power controller 255 sets a set point for bias power supply 256 configured to supply an RF signal, tuned by bias match network 257, to a chuck electrode 208 located within the plasma chamber 204 creating a direct current (DC) bias above electrode 208 which is adapted to receive a substrate 206, such as a semi-conductor wafer work piece, being processed.

A gas supply mechanism or gas source 210 includes sources of gases attached via a gas manifold 217 to supply the proper chemistry required for the processes to the interior of the plasma chamber 204. One source of gas may be the etch gas source 215 that supplies the proper chemistry for etching the conductive layer. Another source of gas may be the deposition gas source 216 that supplies the proper chemistry for depositing onto the conductive layer. A gas exhaust mechanism 218 includes a pressure control valve 219 and exhaust pump 220 and removes particles from within the plasma chamber 204 and maintains a particular pressure within plasma chamber 204.

A temperature controller 280 controls the temperature of heaters 282 provided within the chuck electrode 208 by controlling a heater power supply 284. The plasma processing system 200 also includes electronic control circuitry 270. The plasma processing system 200 may also have an end point detector 260.

Figure 3A:
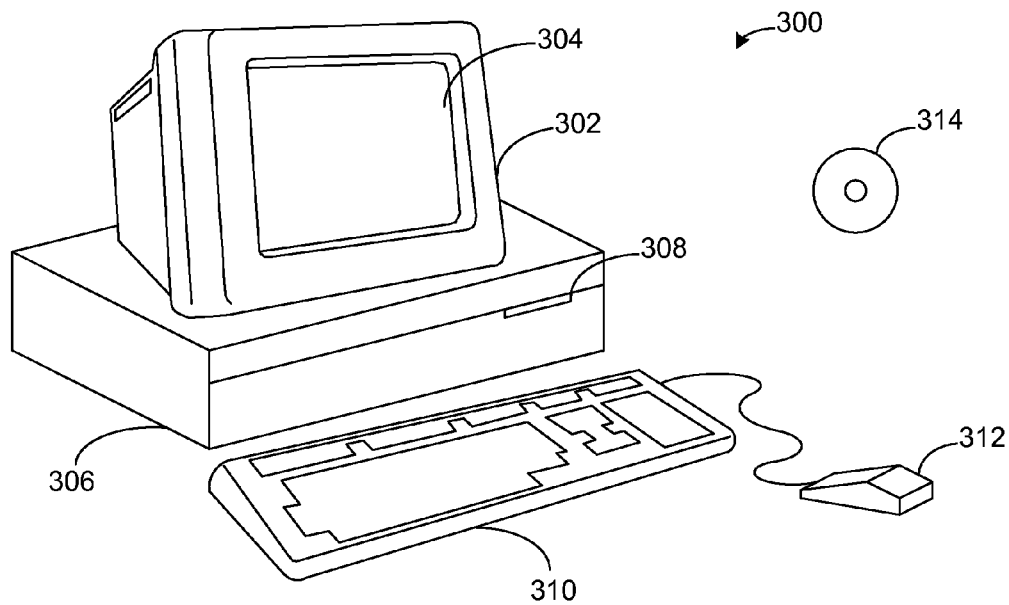
FIGS. 3A-B illustrate a computer system, which is suitable for implementing a controller used in embodiments of the present invention.
Figure 3B:
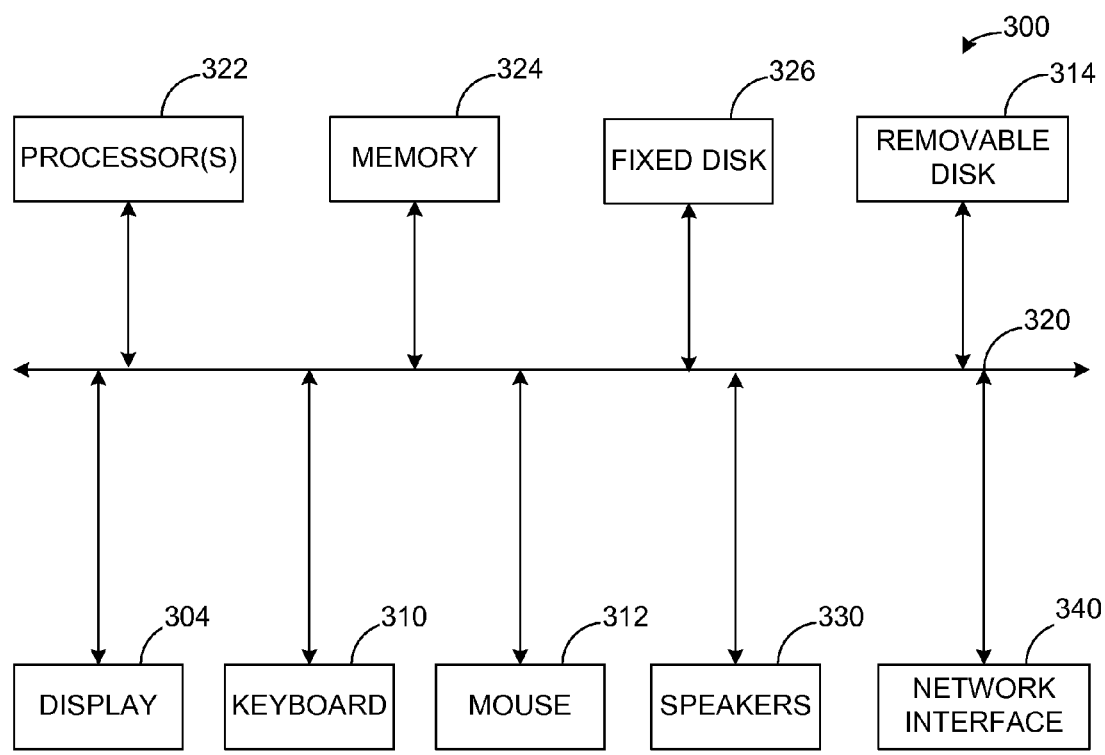

FIGS. 3A and 3B illustrate a computer system, which is suitable for implementing the controller 235 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

To facilitate understanding of the invention, FIGS. 4A-F are schematic views of a stack processed according to an embodiment of the invention.

Figure 4A:
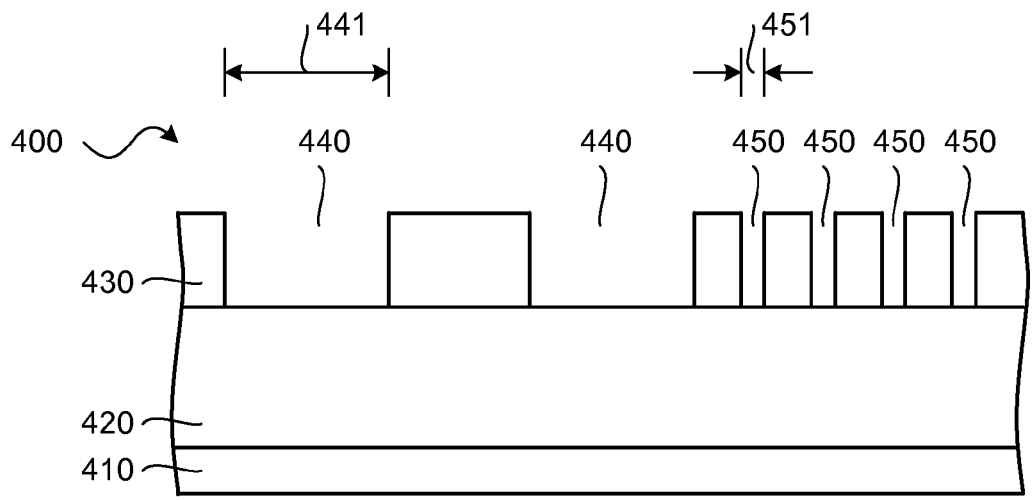
FIGS. 4A-F are schematic views of a stack processed according to an embodiment of the invention.

FIG. 4A is a schematic cross-sectional illustration of a stack 400 with a substrate 410, over which an etch layer 420 is provided. The etch layer 420 is a conductive layer, such as tungsten (W), tungsten silicide ($WSi_2$), or aluminum (Al). A mask layer 430 is formed over the conductive layer 420 (step 100). The mask layer 430 may be a carbon-based mask, such as CH or CF, or an oxide-based hard mask, such as SiO. The mask layer 430 is patterned with both open features 440 and dense features 450.

The widths 441 of the open features 440 are relatively greater than the widths 451 of the dense features 450. In other words, the open features 440 have wider openings than the dense features 450. Thus, the open features 440 may also be referred to as the "wider" features, and the dense features 450 may also be referred to as the "narrower" features. Preferably, the open or wider features 440 are at least 5 times wider than the dense or narrower features 450. More preferably, the open or wider features 440 are at least 10 times wider than the dense or narrower features 450. Most preferably, the open or wider features 440 are at least 20 times wider than the dense or narrower features 450.

Figure 4B:
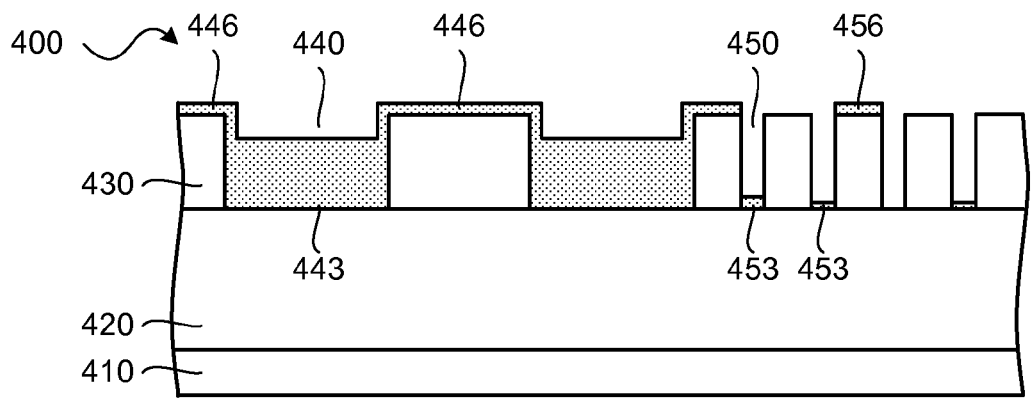

An aspect ratio dependent deposition is made over the conductive layer for a period of time (step 110). FIG. 4B shows a schematic cross-sectional illustration of the stack 400 after the deposition is completed. Deposition 443 inside, and especially on the bottom of the open (wider, low aspect ratio) features 440 is more than deposition 453 inside the dense (narrower, high aspect ratio) features 450 because deposition chemicals go inside the open features 440 faster than the dense features 450. Thus, the deposition is aspect ratio dependent. Preferably, there is at least twice as much deposition on the bottom of the open features 440 than on the bottom of the dense features 450.

Furthermore, the deposition is non-conformal, such that there is much more deposition on the bottom of the features than over the sidewalls of the features. Having little or no deposition over the sidewalls of the features may prevent narrowing the opening of the features. In this example, the deposition may be silicon-oxide (SiO) based, such as using $SiCl_4/O_2$ plasma, or carbon or hydrofluorocarbon (C—H—(F, Cl, Br)) based, such as using $CH_4$/HBr plasma. There may also be some amount of deposition 446, 456 on top of the mask layer 430.

Figure 4C:
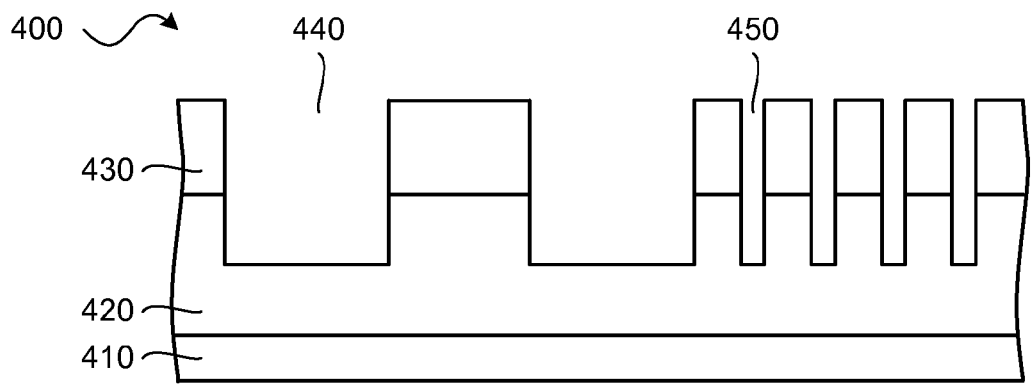

An aspect ratio dependent etch is made of the conductive layer for a period of time (step 120). FIG. 4C shows a schematic cross-sectional illustration of the stack 400 after the etching is completed. The etch process first etches through the deposition 443, 453 deposited over the conductive layer 420 in the previous step (step 110), and then continues to etch the features 440, 450 into the conductive layer 420. The etching of the deposition 443, 453 creates a delay of etching in open (wider) features on conductive layer 420.

The etching of the conductive layer 420 is aspect ratio dependent. It is diffusion limited. The open (wider, low aspect ratio) features 440 are etched faster than the dense (narrower, high aspect ratio) features 450. However, because there has been more deposition 443 on the bottom of the open features 440 than deposition 453 on the bottom of the dense features 450, it compensates for the faster etching of the open features 440, and approximately the same depth of conductive layer 420 is etched away for both open 440 and dense 450 features during the etch step (zero microloading). Reverse or positive microloading can also be achieved by modifying the times of deposition and etch steps.

A determination is made as to whether the etching of the conductive layer is completed (step 130). In FIG. 4C, the conductive layer 420 has not been etched completed—that is, the features have not reached the bottom of the conductive layer 420. Thus, the deposition and etching steps are repeated.

Figure 4D:
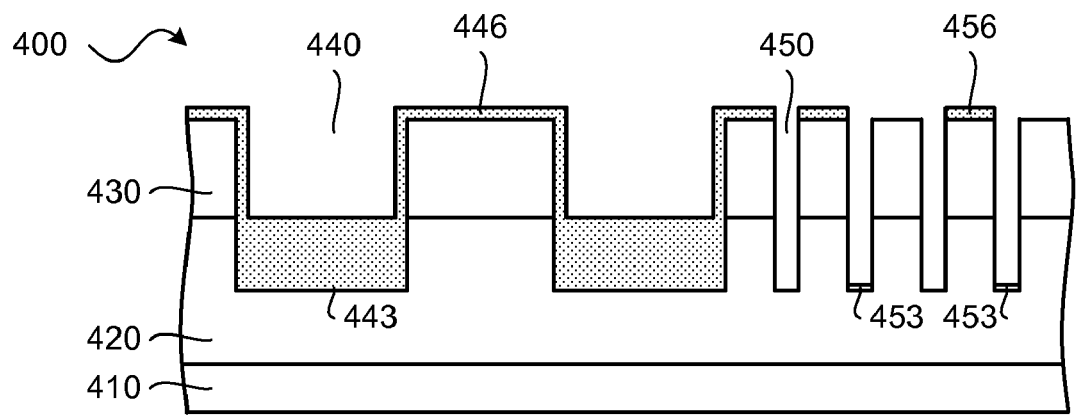

FIG. 4D shows a schematic cross-sectional illustration of the stack 400 after a second deposition is completed. Again, deposition 443 inside the open (wider, low aspect ratio) features 440 is more than deposition 453 inside the dense (narrower, high aspect ratio) features 450. Some dense features 450 have hardly any deposition on their bottom 453. There is more deposition on the bottom of the features than on the sidewalls of the features. And there may also be some amount of deposition 446, 456 on top of the mask layer 430.

Figure 4E:
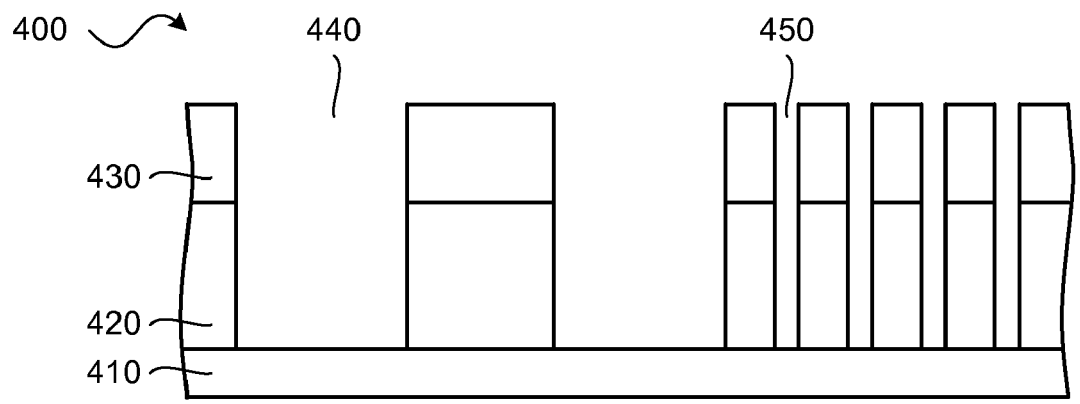

FIG. 4E shows a schematic cross-sectional illustration of the stack 400 after a second etching is completed. At this point, the conductive layer 420 has been etched completely. That is, the etch endpoint in the conductive layer 420 has been reached. The process may be stopped.

Figure 4F:
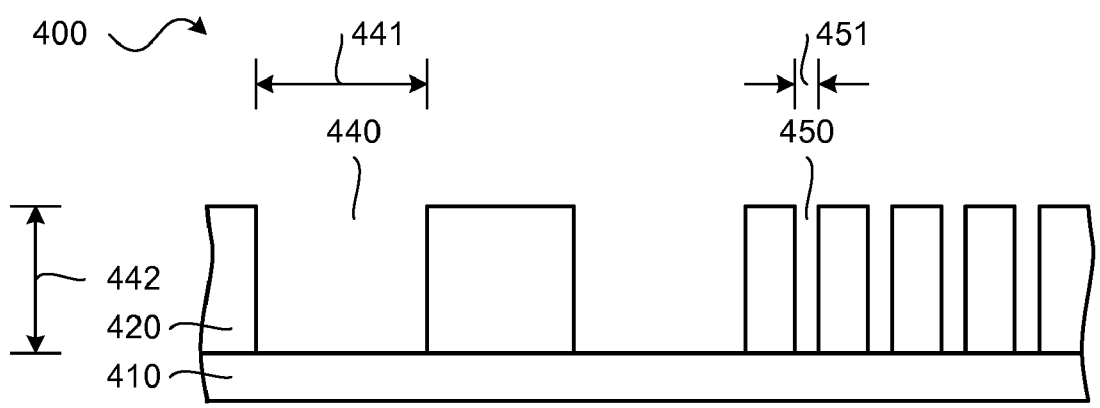

Optionally, the mask layer 430 may be removed (step 140). FIG. 4F shows a schematic cross-sectional illustration of the stack 400 with only the substrate 410 and the conductive layer 420, and the conductive layer 420 have open 440 and close 450 features etched into it. The mask layer 430 has been removed.

The widths 441 of the open (wider) features 440 are relatively greater than the widths 451 of the dense (narrower) features 450. The heights 442 of both the open (wider) features 440 and the dense (narrower) features 450 are approximately the same. Thus, the aspect ratios of the open (wider) features 440 are relatively lower or smaller than the aspect ratios of the dense (narrower) features 450. In this example, the aspect ratios of the features in the conductive layer 420 may be greater than 1:1. In another example, the aspect ratios of the features in the conductive layer 420 may be greater than 7:1. In a third example, the aspect ratios of the features in the conductive layer 420 may be greater than 15:1. In this example, the widths of the dense (narrower) features are approximately 30 nanometers (nm) or less. The heights of the features are approximately 220 nm or more.

In this example, the deposition and etching steps are repeated only once, because in this example, the etch endpoint is reached when the conductive layer 420 is etched completely. In other examples, the deposition and etching steps may be repeated as many times as necessary in order to reach the predefined etch endpoint in the conductive layer 420. Using multiple deposition and etching cycles prevents depositing too much material over the sidewalls (profiles) of the features, and thus narrowing the openings of the features. The method also provides low mask erosion rate. In addition, the deposition and etching steps may be done either in-situ, inside the same plasma reactor, or in separate equipments.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

The invention claimed is:

1. A method for etching features of different aspect ratios in a conductive layer, comprising
   depositing over the conductive layer with an aspect ratio dependent deposition, wherein the depositing selectively deposits more on bottoms of wider features than bottoms of narrower features and sidewalls of the features;
   etching features into the conductive layer with an aspect ratio dependent etching of the conductive layer, wherein the etching selectively etches the wider features faster than the narrower features, and wherein the etching removes the deposition and the etching of the deposition finishes in the narrower features before the wider features, and wherein the etching of the conductive layer starts on the narrower features before the wider features; and
   repeating the depositing and the etching at least once;
   wherein the depositing is stopped before the features are significantly narrowed.

2. The method, as recited in claim 1, wherein the depositing deposits a silicon-oxide or hydrofluorocarbon based deposition.

3. The method, as recited in claim 2, wherein the conductive layer is one selected from the group consisting of tungsten (W), tungsten silicide (WSi$_2$), and aluminum (Al).

4. The method, as recited in claim 3, wherein aspect ratios of the features are greater than 7:1.

5. The method, as recited in claim 4, wherein widths of wider features are at least 5 times wider than widths of narrower features.

6. The method, as recited in claim 5, wherein the widths of narrower features are not greater than 30 nanometers.

7. A method for etching features of different aspect ratios in a conductive layer, comprising:
   depositing over the conductive layer with an aspect ratio dependent deposition;
   etching features into the conductive layer with an aspect ratio dependent etching of the conductive layer; and
   repeating the depositing and the etching at least once, wherein
      aspect ratios of the features are greater than 7:1,
      widths of wider features are at least 5 times wider than widths of narrower features,
      the depositing selectively deposits more on bottoms of the wider features than bottoms of the narrower features and sidewalls of the features and
      the etching selectively etches the wider features faster than the narrower features.

8. The method, as recited in claim 7, wherein the etching removes the deposition and the etching of the deposition finishes in the narrower features before the wider features.

9. The method, as recited in claim 7, wherein the etching of the conductive layer staffs on the narrower features before the wider features.

10. The method, as recited in claim 7, wherein the depositing is stopped before the features are significantly narrowed.

\* \* \* \* \*